(12) United States Patent
Socarras

(10) Patent No.: US 8,914,691 B2
(45) Date of Patent: Dec. 16, 2014

(54) METHODS AND SYSTEMS FOR PERFORMING SCAN TESTING TO IDENTIFY LOGIC DEVICE DEFECTS

(75) Inventor: Angel Socarras, Lake Mary, FL (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 196 days.

(21) Appl. No.: 13/546,775

(22) Filed: Jul. 11, 2012

(65) Prior Publication Data

US 2013/0162285 A1   Jun. 27, 2013

Related U.S. Application Data

(60) Provisional application No. 61/578,663, filed on Dec. 21, 2011.

(51) Int. Cl.
*G01R 31/28* (2006.01)
*G01R 31/3185* (2006.01)
*G06F 11/263* (2006.01)

(52) U.S. Cl.
CPC ...... *G01R 31/318563* (2013.01); *G06F 11/263* (2013.01)

USPC .......................................................... 714/726

(58) Field of Classification Search
USPC .................. 714/718, 724, 726, 729, 735, 824
See application file for complete search history.

(56) References Cited

U.S. PATENT DOCUMENTS

| 7,055,077 B2* | 5/2006 | Kiryu et al. ................... 714/726 |
| 7,225,374 B2* | 5/2007 | Burdine et al. ............... 714/726 |
| 7,603,600 B2* | 10/2009 | Satsukawa .................... 714/729 |

* cited by examiner

*Primary Examiner* — Shelly A Chase
(74) *Attorney, Agent, or Firm* — Volpe and Koenig, P.C.

(57) ABSTRACT

Provided is a method of testing a logic device. The method includes comparing a first test pattern provided at an input of a first chain of logic device sub-modules with an output from the first chain to determine first type failures and comparing a second test pattern provided at an input of a second chain of logic device sub-modules with an out from the second chain to determine second type failures. An occurrence of one of the first type failures renders the logic device inoperable. An occurrence of the second type of failures is tolerated.

15 Claims, 9 Drawing Sheets

FIG. 7

METHODS AND SYSTEMS FOR PERFORMING SCAN TESTING TO IDENTIFY LOGIC DEVICE DEFECTS

CROSS REFERENCE TO RELATED APPLICATIONS

This application claims benefit under 35 U.S.C. 119(e) to U.S. Provisional Patent Application No. 61/578,663, Dec. 21, 2011, which is incorporated by reference herein in its entirety.

BACKGROUND

1. Field of the Invention

The present invention relates to semiconductor chip manufacturing. More particularly, the present invention relates to accommodating defects in the logical structure of semiconductor chips.

2. Background Art

Defect tolerances can be a critically important consideration in the manufacture of semiconductor chips. These considerations impact performance, yield, and ultimately cost. Thus, an important goal in the semiconductor manufacturing process is to minimize the occurrence of chip defects and reduce the impact of any defects that occur.

Traditional semiconductor manufacturing techniques typically result in the production of a predictable percentage of chips with defects. These defects occur because inherent impurities, such as dust or other particles, contaminate wafers that are used to form the chip during manufacturing. Unfortunately, the introduction of these inherent impurities can never be completely prevented. Consequently, most semiconductor wafer lots will include a small percentage of chips with inherent defects.

Depending on the ultimate function of the chip, some defects can be tolerated depending upon the number and nature of the defects. However, these defects become more problematic when they occur in devices that perform critical processing functions, such as math computations. For example, a single defect occurring in a particular module of some devices will render the device inoperable. Defects occurring in other modules, within that same device, may not necessarily render the entire device inoperable. Therefore, these latter defects could be tolerated within the device, on some scale.

The single instruction multiple data (SIMD) device (module), as understood by those of skill in the art, is a multi-processor architecture in which multiple processing elements perform the same operation on multiple data simultaneously. SIMDs are considered to be the computational workhorses, for example, of graphics processing devices. Conventional SIMDs are designed to include a small number of redundant sub-modules in anticipation of manufacturing defects that might occur in other modules. After manufacture, these SIMDs are evaluated to determine the nature and number of manufacturing defects. If the nature and number of defects are below a certain threshold, the device can still be used, albeit, at perhaps a degraded level of performance. On the other hand, if the nature and number of defects exceeds the threshold, the device is considered unusable.

SUMMARY OF EMBODIMENTS

What are needed, therefore, are methods and systems to more efficiently test, identify, and compensate for manufacturing defects in logic devices, such as SIMDs.

Embodiments of the present invention, in certain circumstances, provide a method of testing a logic device. The method includes comparing a first test pattern provided at an input of a first chain of logic device sub-modules with an output from the first chain to determine first type failures and comparing a second test pattern provided at an input of a second chain of logic device sub-modules with an output from the second chain to determine second type failures. An occurrence of one of the first and second type failures renders the logic device inoperable methods and systems to identify and reduce the effect of defects in logical components of integrated circuit (IC) devices.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention. Various embodiments of the present invention are described below with reference to the drawings, wherein like reference numerals are used to refer to like elements throughout.

FIG. 7 is an exemplary illustration of a render-back SIMD arrangement in accordance with an embodiment of the present invention;

DETAILED DESCRIPTION OF THE EMBODIMENTS

In the detailed description that follows, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The term "embodiments of the invention" does not require that all embodiments of the invention include the discussed feature, advantage or mode of operation. Alternate embodiments may be devised without departing from the scope of the invention, and well-known elements of the invention may not be described in detail or may be omitted so as not to obscure the relevant details of the invention. In addition, the terminology used herein is for the purpose of describing particular embodiments only and is not intended to be limiting of the invention. For example, as used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
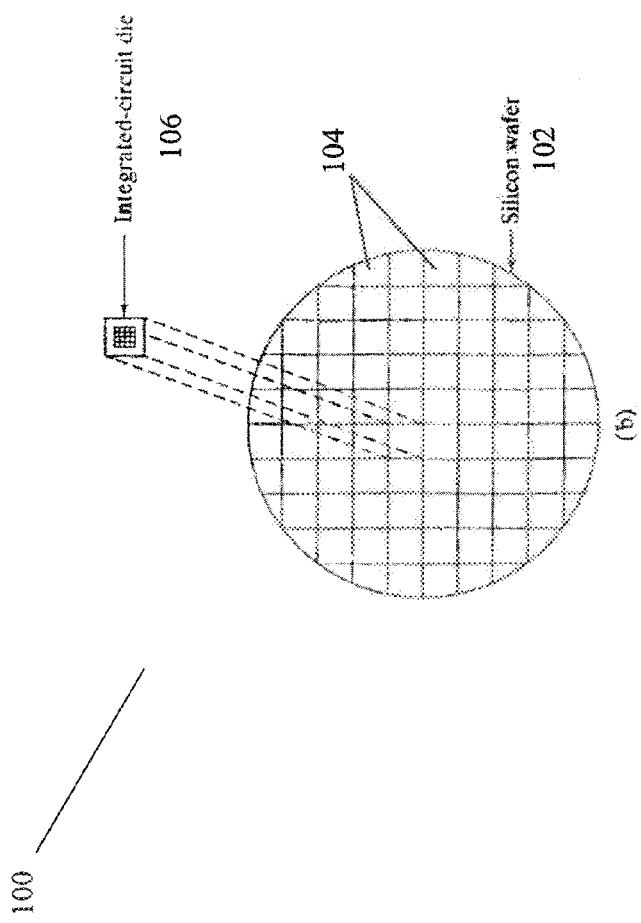
FIG. 1 is an illustration of an exemplary wafer constructed in accordance with an embodiment of the present invention.

FIG. 1 is an exemplary layout arrangement 100 of a silicon wafer 102. Wafer 102 includes a plurality of sections 104, each representing an IC die, such as IC die 106. In embodiments of the present invention, a single wafer, such as wafer 102, can produce different qualities of dies that can be used across different product segments. A top-quality (highest quality) product, for example, would use those IC dies with the fewest number of defects. A representative top-quality product, for example, could be a desktop computer or the like.

IC dies that experience a higher number of defects during design and manufacturing, though still usable, may be suitable for use in a pro-quality (lower quality) product. A representative pro-quality product, for example, could be a low end notebook computer. The higher the quality of the individual IC dies within the wafer, the faster those ICs will be. The speed of an IC is a direct correlation of the number of compute units provided therein. By way of example, a compute unit can include one or more SIMDs. Faster ICs, those with the fewest defects, are typically more suitable for use in the top-quality products.

Figure 2:
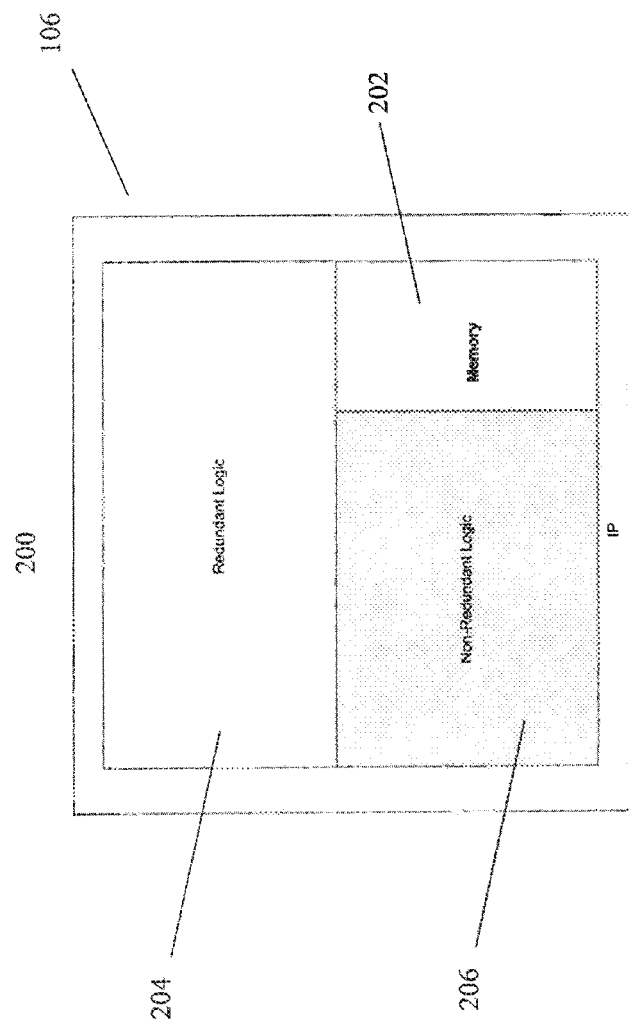
FIG. 2 is an exemplary illustration of a modeling layout of the logic structure of an individual IC die in accordance with an embodiment of the present invention.

FIG. 2 is an exemplary illustration of a modeling layout 200 of the logic structure of an individual IC die, such as the IC die 106. In FIG. 2, the modeling layout 200 includes a memory area 202, a redundant logic area 204, and a non-redundant logic area 206. The internal structure of the memory area 202, the redundant logic area 204, and the non-redundant logic area 206, will be explained in greater detail below.

The term redundant, as used herein, represents the incorporation of additional logic units in the design of an IC so that the function of the IC is not impaired due to the occurrence of one or more defective logic units. In other words, although one or more individual logic units may be defective, the entire IC is not rendered inoperable. Stated another way, there is a predetermined level of defect tolerance (redundant logic area 204) built into the IC. This defect tolerance enables the IC to still perform, albeit at a sub-optimal level. This defect tolerance is provided within the redundant logic area 204.

However, if a defect occurs in the non-redundant logic area 206, the IC is rendered completely inoperable. A more detailed illustration of the modeling layout 200 is illustrated in FIG. 3.

Figure 3:
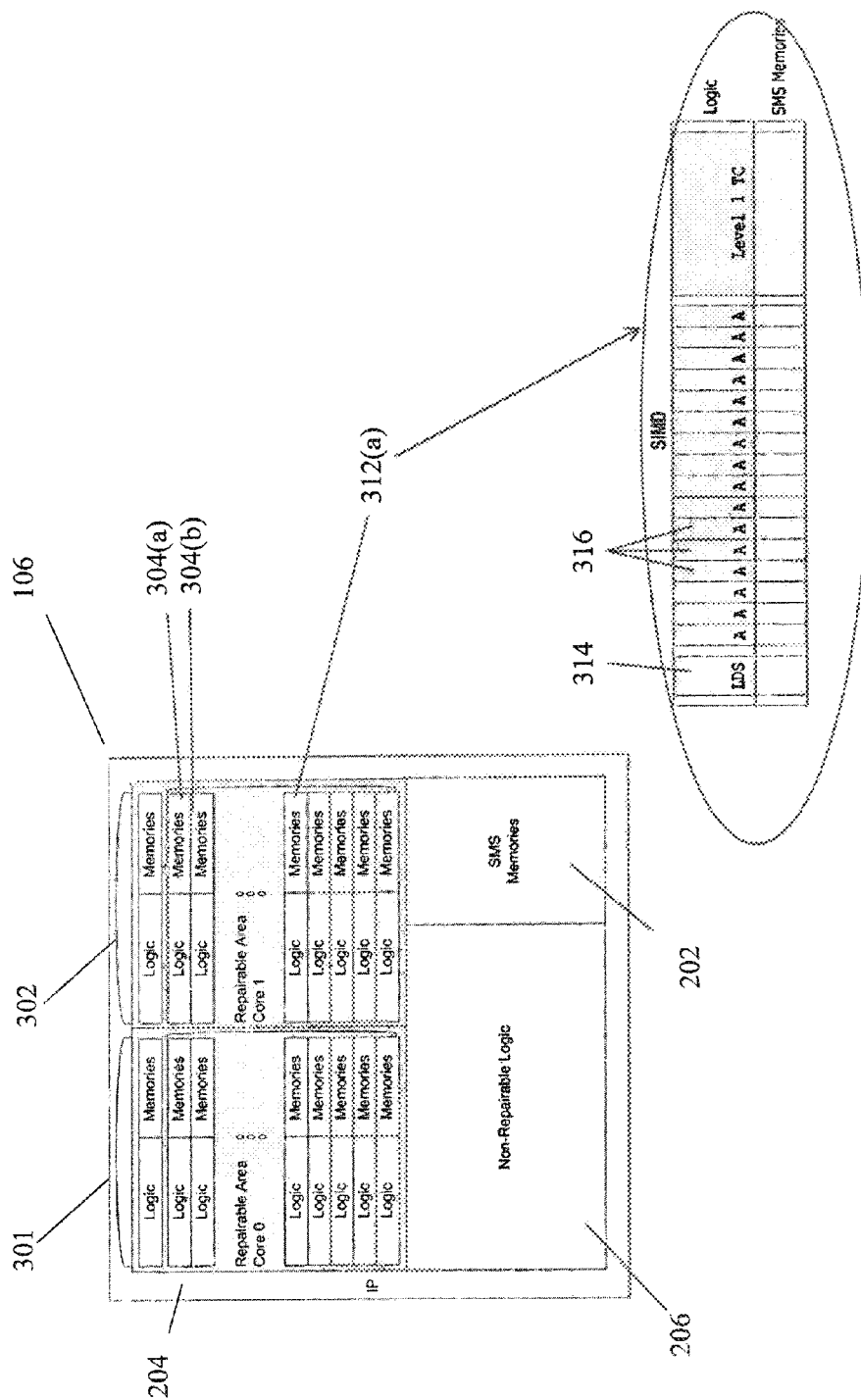
FIG. 3 is a more detailed view of logic areas within the IC illustrated in FIG. 2.

In the exemplary illustration of FIG. 3, the redundant logic area 204 of the IC die 106 includes a repairable area cores 301 and 302. Each of the cores 301 and 302 is further subdivided into a number of horizontal rows, each representative of an individual SIMD, such as SIMDs 304(a), 304(b), and 312(a). In FIG. 3, an expanded view of SIMD 312(a) is provided.

SIMD 312(a) includes, for example, a logical data structure (LDS) unit 314, along with arithmetic (A) units, such as units 316. Also as illustrated, SIMD 312(a) is further subdivided into logic areas and memory areas.

Redundancy, or defect tolerance, is a function of an analysis of the logic units within the IC to determine which units can be repeated, and how many times, during manufacturing. These repeated units are representative of the built-in defect tolerance, noted above. If any of the logic units within the defect tolerant area (redundant logic) fails, the entire IC is not rendered inoperable since the logic unit was repeated many times. If failures occur in the redundant logic areas of the IC, although the IC can still be used, it is simply used in products with a lower quality profile.

Figure 4:
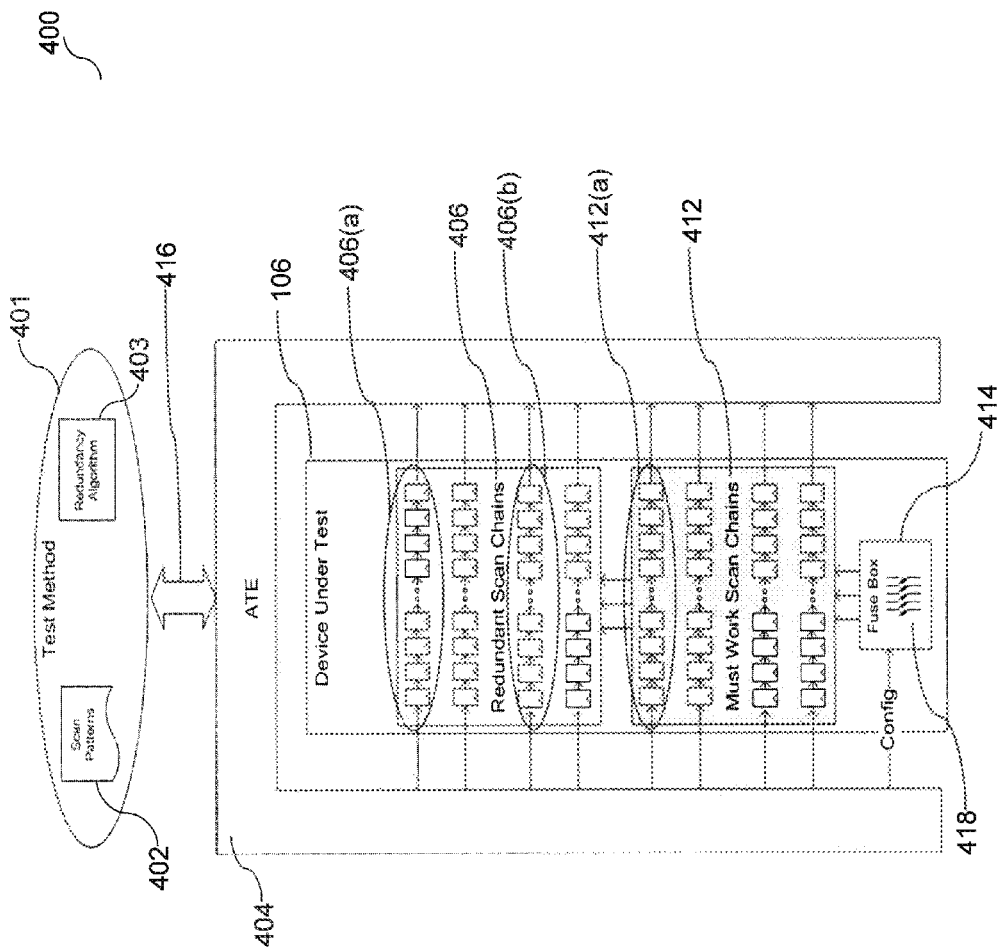
FIG. 4 is an exemplary illustration of an IC modeling of approach in accordance with an embodiment of the present invention.

FIG. 4 is an exemplary illustration of a modeling approach 400 constructed in accordance with an embodiment of the present invention. In FIG. 4, a device such as IC die 106 is modeled and placed under test. In the embodiments, testing occurs in accordance with specific test methodology, such as test methodology 401.

In the exemplary illustration of FIG. 4, test methodology 401 includes a scan pattern analysis 402 and use of a redundancy technique 403, each described in greater detail below. During an actual test, test methodology 401 is performed on a device, such as IC die 106, using an automated test equipment (ATE) mechanism 404. By way of example, during testing, redundant logic area 204 and non-redundant logic area 206, shown in FIG. 2, are further modeled. More specifically, redundant logic area 204 is further modeled to expose a redundant scan chain section 406. Non-redundant logic area 206 is further modeled to expose a "must work" scan chain section 412. As used herein, the term "must work" conveys that if a single scan chain (logic device) within section 412 fails, IC die 106 will be rendered completely inoperable.

In FIG. 4, a redundant scan chain section 406 includes individual SIMDs within IC die 106 divided into their most basic electrical circuit elements (i.e., flip flops). For example, SIMD 304(a) of FIG. 3 is modeled (characterized) to produce redundant scan chain 406(a), shown as individual flip-flops connected to form a chain, along with redundant scan chain 406(b). Also shown in FIG. 4 is must work scan chain section 412. Must work scan chain section 412, among other scan chains not labeled, includes scan chain 412(a). By way of example, scan chain 412(a) corresponds to SIMD 312(a) of FIG. 3.

In the embodiments, the remainder of IC die 106 can be analyzed with its logic being classified as "must work" or "can be allowed to fail." A fuse box 414, illustrated in greater detail below, is used in a multiplexer configuration to facilitate testing, identification, and isolation of specific defective scan chains.

By way of example, after a test has been performed in accordance with test methodology 401, a user will know whether a defect has occurred in the "must work" part of the IC die 106. Consequently, the user will know if the defect has rendered the device inoperable. This principle is known as "stop and fail." If a defect occurs in the "can be allowed to fail" category, these defects can be accumulated under a principle known as "continue and fail." The inventor of the subject matter of the present application has noted during testing that the stop and fail category typically represents about 5% of a given IC die design. The continue and fail category typically represents about 95% of the IC die design.

The benefit of the foregoing technique is that once test methodology 401 has been performed, the user will know to what extent if at all, a particular IC die such as IC die, such as IC die 106, can be used if it includes defective SIMDs. This knowledge can ultimately increase IC die manufacturing efficiency and facilitate more realistic pricing models.

In an exemplary embodiment of the present invention, test methodology 401, ATE 404, and fuse box 414 cooperatively operate to facilitate a more efficient and secure IC design. In the embodiment, IC chips are designed to include e-fuses burned into the chip such that during subsequent activations, it's known that particular SIMDs are bad. This is also a fail-safe mechanism, preventing the use of devices with defect specifications that exceed approved levels. This technique also enhances security by reducing cyber threats—preventing a computer hacker, for example, writing into particular IC chip registers and causing malfeasance.

Thus, in the illustration 400 of FIG. 4, arrow 416 is representative of a mechanism for testing the IC die and the embedded e-fuse. More specifically, fuse box 414 includes special pins 418 to facilitate identification of defective SIMDs during testing. The special pins 418 also enable special programming that helps compensates for any identified defective SIMDs.

In an embodiment of the present invention, a flexible scheme is provided for IC design and testing to: (a) determine whether defective SIMDs are present, (b) if defective SIMDs exist, to identify their location; (c) classify whether the defective SIMDs are redundant SIMDs or must work SIMDs, and testing the SIMDs based on this knowledge; and (d) facilitating the proper adjustments in reconfiguring the IC die based upon the defective SIMDs.

Figure 5:
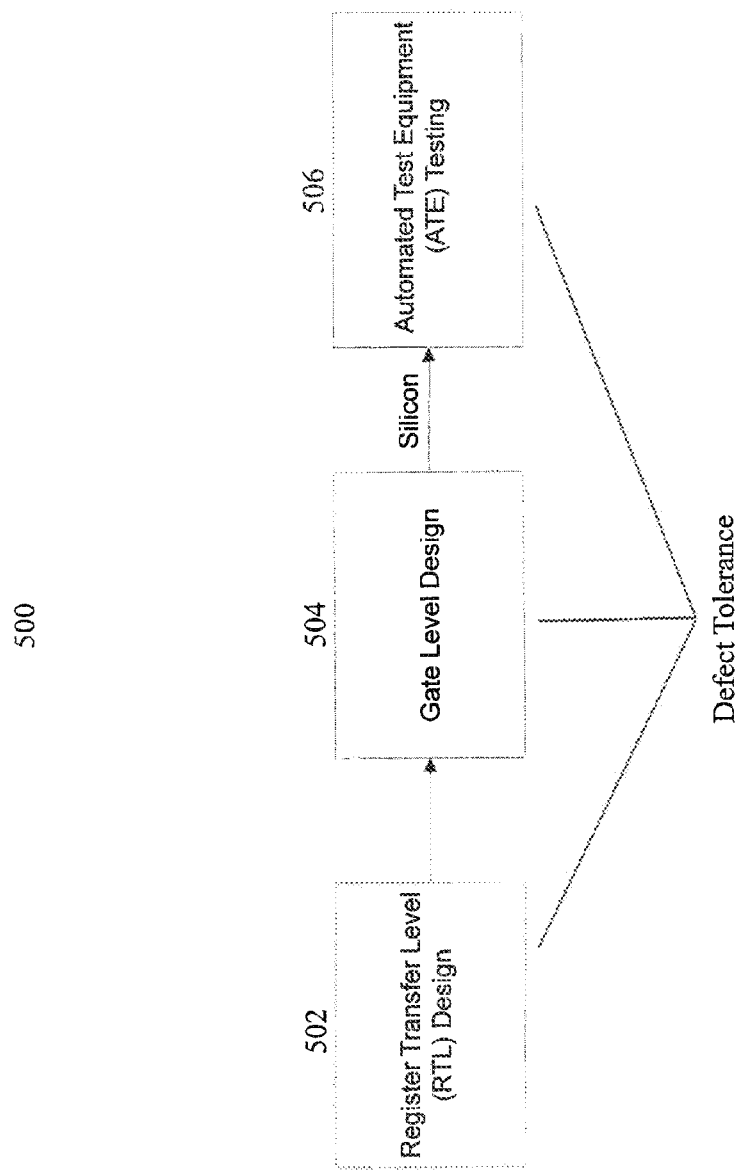
FIG. 5 is a block diagram illustration of defect tolerance methodology used in accordance with embodiments of the present invention.

FIG. 5 is a high level illustration 500 of various aspects of the embodiments of the present invention. More particularly, FIG. 5 depicts that defect tolerance techniques are provided throughout multiple stages of IC device development. As described and illustrated herein, embodiments of the present invention include aspects of defect tolerance considerations that occur at the register transfer level (RTL) phase 502 of IC chip design. Embodiments also include techniques, such as the defect tolerance techniques noted above, that occur during gate level design phase 504 of IC chip design. Further embodiments of the present invention include defect tolerance considerations that occur during an automated testing phase 506, and are facilitated through use of various ATE configurations. Each of the phases 502, 504, and 506, need not be performed in their entirety in the order they appear in FIG. 5. Greater details of each of these stages are provided below.

Figure 6:
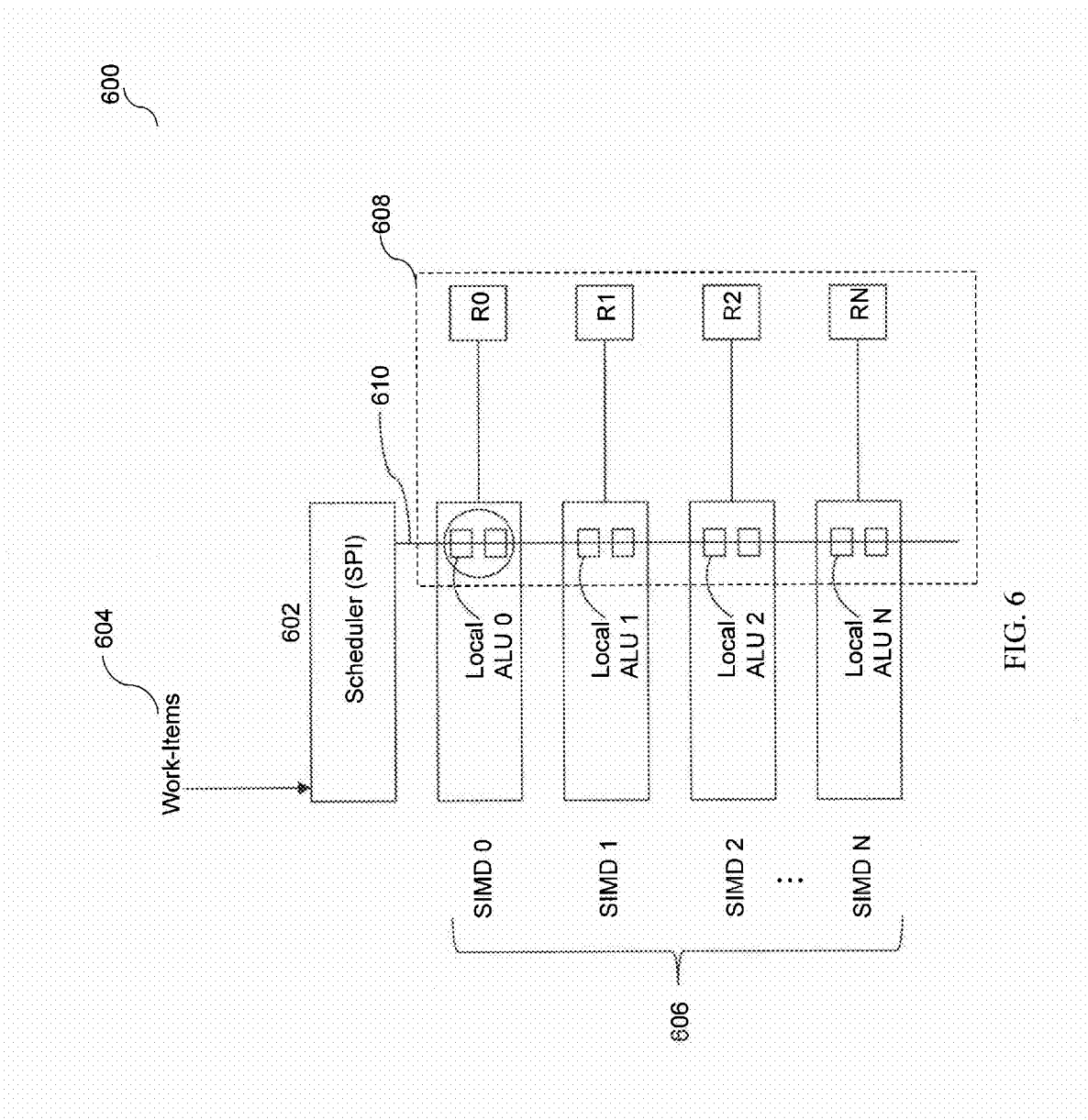
FIG. 6 is an illustration of an exemplary defect tolerant design constructed in accordance with an embodiment of the present invention.

FIG. 6 is an illustration of an exemplary embodiment of the present invention, including an arrangement 600 designed into the render-back end of an IC die. Arrangement 600 is provided to facilitate IC defect tolerant principles in accordance with the present invention. As illustrated in FIG. 6, arrangement 600 includes a scheduler 602 for scheduling work items 604 for processing within a pipeline of a graphics processing unit (GPU), not shown. Scheduler 602 can be formed from standard GPU pipeline components, such as a shader processor input (SPI). By way of example, a GPU constructed in accordance with the present invention includes a number of SIMDs, such as SIMD group 606. SIMD group 606 includes SIMD 0 to SIMD N. Arrangement 600 also includes a multiplexing device 608 to facilitate identification and switching in/out defective SIMDs from SIMD group 606.

In one embodiment of arrangement 600 illustrated in FIG. 6, one or more spare SIMDs are provided during design that can be swapped out with later identified defective SIMDs, as is more clearly illustrated in FIG. 7.

Figure 7:
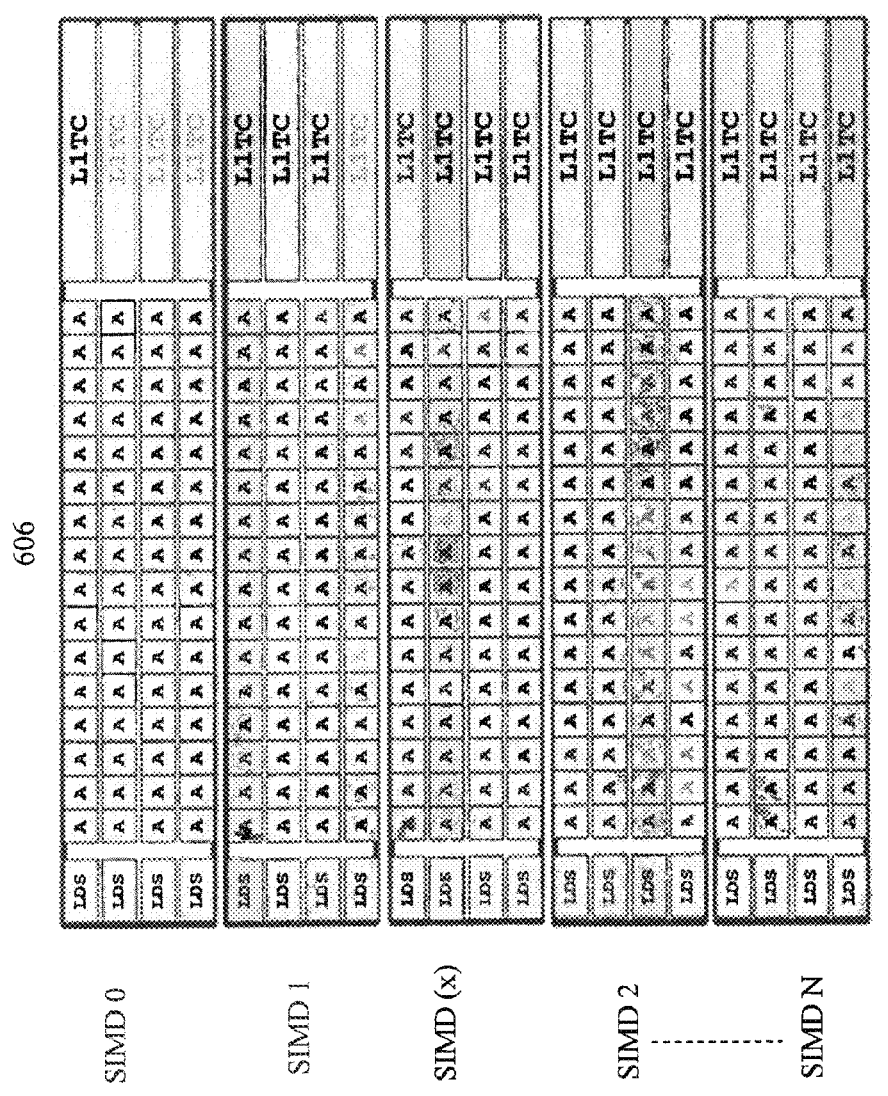

FIG. 7 is an exemplary illustration of an embodiment of the present invention implementing render-back redundancy. In FIG. 7, for example, SIMD group 606 of FIG. 6 can include one or more redundant SIMDs, such as SIMD (X). SIMD (X), or any other redundant SIMD, is multiplexed (i.e., swapped in) and activated only when one or more of operational SIMDs 0-N is identified as being defective. With render-back, instead of allowing an IC device to continue to operate with a failed logic component, such as a defective SIMD, a redundant or spare SIMD is integrated with the remaining operational SIMDs. This approach is referred to herein as SIMD repair.

Returning back to FIG. 6, and as noted above, arrangement 600 is configured to facilitate detection and segregation of faulty logic components, such as defective SIMDs, in IC dies. During operation, scheduler 602 receives work items 604 and distributes those work items across SIMDs 0-N along a communications bus 610. Communications bus 610, then forwards the work items across SIMDs 0-N to the local processing units, such as ALUs 0-N, respectively.

Each of the SIMDs 0-N can perform an equal share, or a predetermined percentage, of the distributed work items. Alternatively, each of the SIMDs 0-N can or can operate under any one of known work distribution schemes, such as round robin, or in accordance with a time quanta. In one exemplary approach, after each SIMD completes its assigned work item (e.g., computations), in serial fashion for example, it forwards the results of its work to an adjacent SIMD within the SIMD group 606.

Although ALUs 0-N reside within respective SIMDs 0-N, ALUs 0-N also operate as components of multiplexer 608. Multiplexer 608 also includes respective configuration registers R0-RN to indicate whether its respective ALU is defective. Each configuration register R0-RN, for example, records the operational status (i.e., determination of defectiveness) of its corresponding SIMD.

In the exemplary illustration of FIG. 6, when a defect occurs in one of the SIMDs 0-N, a defect bit is set in its corresponding configuration register R0-RN. The setting of the defect bit within the configuration register signals multiplexer 608 that work should not be distributed to the corresponding defective SIMD. Multiplexer 608 and scheduler 602 cooperatively remove the functionality of the defective SIMD from the communications bus 610.

At the same time, scheduler 602 can simply redistribute work across all remaining available SIMDs, or via multiplexer 608, can switch in a redundant SIMD, such as SIMD (X) illustrated in FIG. 7, and switch out the defective SIMD. During an exemplary operation, work that would have been assigned to the defective SIMD can simply be passed through that SIMD to adjacent SIMDs or to the redundant SIMD (X). Although the work (e.g., data) is passed through the defective SIMD, the defective SIMD will not perform any computational work on that data. The functionality or load of the defective device is spread across the other remaining devices. Each SIMD is capable of performing the work of all of the other SIMDs. In this manner, when one SIMD is taken out, the work load is absorbed by the remaining SIMDs.

By way of example, once a SIMD becomes defective, a signal can be transmitted from the defective SIMD, for example, forwarding instructions to the multiplexer. In this manner, scheduler 602 then knows, for example, there are now three operational SIMDs out of the four SIMDs. As a consequence, and as noted above, scheduler 602 then redistributes the work items 604 across the three remaining operational SIMDs instead of the four total SIMDs, Control registers R0-RN, local ALUs 0-N, and communications bus 610 provide a mechanism by which scheduler 602 knows to activate and deactivate specific SIMDs that failed during activation, This information is available to scheduler 602 by virtue of the corresponding control register's defect bit being set and read by scheduler 602. Stated another way, embodiments of the present invention enable scheduler 602 to know when one of SIMDs 0-N is defective.

Other aspects of the present invention facilitate segregating logic within a SIMD to discern "must work" logic vs. "can be allowed to fail" logic. To accommodate this feature, there are changes within the RTL aspect of the IC chip design in which segregating logic is provided. This segregating logic aids in distinguishing sections of the SIMD that have failed and render the device inoperable from sections that can still perform work after having experienced some level of failure. Otherwise, a single defect can destroy an entire IC device. Desirably, all defective logic devices have been segregated prior to the wafer testing phase. Aspects and features of the present invention facilitate this process.

As noted above, during the IC device power-up phase, scheduler 602 reads each of the control registers R0-RN to determine whether any of the SIMDs 0-N is defective and identifies the defective SIMDS. During power up, for example, scheduler 602 may know it is scheduled to receive work-items 604 and that work-items 604 must be distributed across all of the computational resources (e.g., SIMDs 0-N). Scan testing, performed in accordance with embodiments of the present invention, enables the segregation of, and compensation for, defective SIMD logic.

Figure 8:
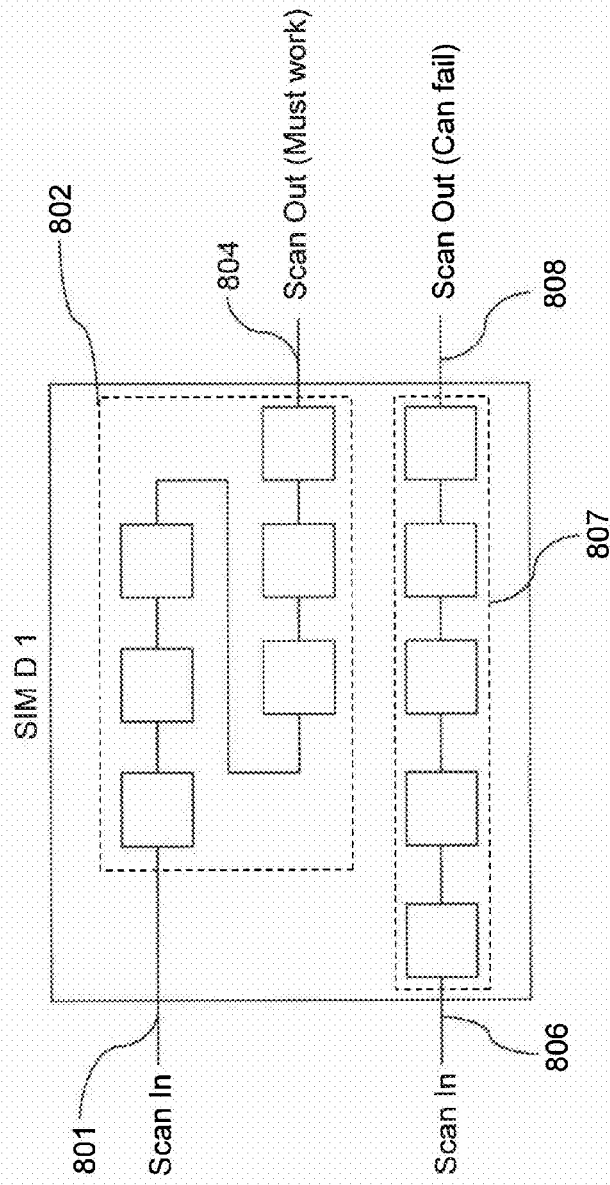
FIG. 8 is an illustration of exemplary test methodology performed in accordance with an embodiment of the present invention.

FIG. 8 is an illustration of exemplary scan test methodology 800 provided in accordance with an embodiment of the present invention. Within methodology 800, logic components within individual SIMDs can be tested to determine whether defective logic components exist and if so, whether they can be segregated from non-defective components.

As understood by those of skill in the art, SIMDs are comprised, among other things, of large numbers of flip-flops. These individual flip-flops can be tested via a special test process referred to herein as "scan in" and "scan out." During scan in and scan out, a predefined test pattern is shifted in and shifted out of the flip-flop scan chains, such as scan chains 406(a), 406(b), and 412(a) shown in FIG. 4. In the embodiments, for example, a known bit stream can be provided as an input to the scan chain. This known bit stream is compared with the bit stream that appears at the output of the scan chain to distinguish "must work" components (e.g., 412) from "allowed to fail" components (e.g., 406).

In test methodology 800 of FIG. 8, for example, a SIMD 1 is configured to receive a known bit stream (not shown) at a "scan in" input pin 801. The test bit stream is then transmitted through the flip-flop scan chain 802 and is provided at a scan out output pin 804. As depicted in FIG. 8, scan chain 802 is a "must work" scan chain. The output bit stream is compared (e.g., via use of a comparator) with the input bit stream to determine whether logic defects exist in components of the must work scan chain 802.

At the same time, another known bit stream is provided to input pin 806 of SIMD 1 to test the "allowed to fail" scan chain 807. This input bit stream is compared with the output bit stream appearing at an output pin 808 to determine whether logic defects exist in components of the allowed to fail scan chain 807.

The information gathered from the test methodology 800 of FIG. 8 provides instrumental data for use during the gate level design (GLD) phase (i.e., 504 of FIG. 5). For example, if a defect was recorded in the must work scan chain 802, during the GLD infrastructure design associated with SIMD 1, the IC chip can be discarded. This precludes the need to perform ATE testing, which can save significant time and costs since testing time is a significant portion of IC device cost.

In the exemplary embodiment of FIG. 8, the tested bit streams (i.e., test pattern) are representative of the internal logic structure of SIMD 1. In other words, during high-level RTL design (i.e., 502 of FIG. 5), at least two sets of scan chains are designed. One set is the "must work" scan chain and the other set is "an allowed to fail" scan chain. This design is then sent to a GLD development group where it is determined how to test the IC device that has been produced. The high-level IC design is then synthesized and made into gates during the level design. Finally, during the tape out process, the design is made into a chip and is turned into silicon. The silicon IC chip is then tested during ATE testing (i.e., 506 of FIG. 5).

Figure 9:
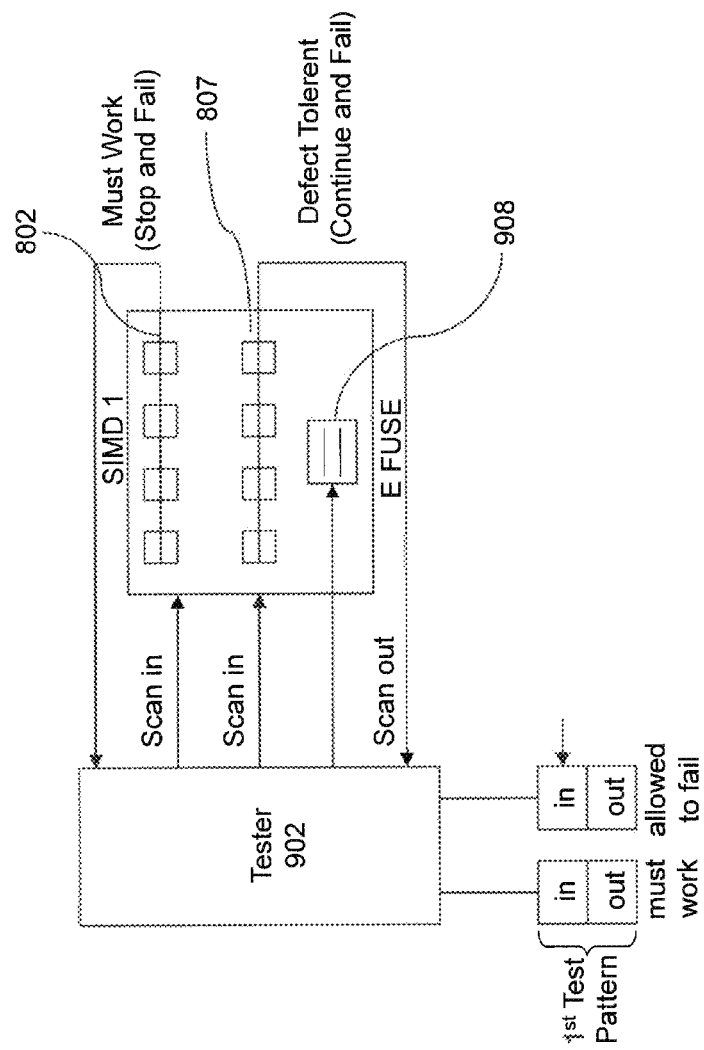
FIG. 9 is an illustration of exemplary test equipment constructed and arranged in accordance with an embodiment of the present invention.

FIG. 9 is an exemplary illustration of a test configuration 900 constructed to perform testing methodology 800 illustrated in FIG. 8 in accordance with an embodiment of the present invention. More specifically, in FIG. 9, test configuration 900, including an ATE tester mechanism 902, can be configured to test SIMD 1 in accordance with testing methodology 800.

In FIG. 9, ATE tester mechanism 902 is configured to transmit the bit stream (e.g., logical 1s and 0s) through SIMD 1 and read the output bit stream. This technique provides an ability to isolate SIMDs determined have defective logic components during testing. In the embodiment, ATE tester mechanism 902 is coupled to a must work scan in/scan out register 904, and an allowed to fail scan in/scan out register 906. A first test pattern is configured for input to the register 904 in order to determine the operational status of logic within the must work scan chain 802. Similarly, a second test pattern is provided as an input to register 906 in order to determine the operational status of logic within the allowed to fail scan chain 807.

An e-fuse module 908 is coupled to tester 902. E-fuse module 908 includes pins, fuses, and other circuitry that facilitate special programming. This special programming facilitates identification, tracking, and compensation for defects that occur within the logic device sub-modules (e.g. flip-flops) of logic devices being tested.

For example, when a user performs an ATE test, e-fuse module 908 enables the user to determine whether logic within one of the SIMDs 0-N has a defect. In the example, the user will also know the defect has not only occurred in SIMD 1, of the SIMDs 0-N, but which sub-modules within SIMD 1 have failed. The information available via e-fuse module 908 also enables the user to know whether the defects within SIMD 1 are "stop and fail" or "continue and fail" type defects.

During the example above, tester 902 can be configured to apply a voltage to fuses associated logic sub-modules within SIMD 1 such that when a user receives IC chip 106, and places it on a circuit board, the circuit board is powered up, SIMD 1 is automatically de-activated if defects therein are of the "stop and fail" type. E-fuse module 908 also permits writing to one or more of the corresponding control registers R0-RN to isolate the identified defective SIMD and compensate for its deactivation.

During an exemplary operational scenario, a tester can load these patterns from a file that specifies timing and voltage levels of signals to be applied to a SIMD under test via tester 902. Multiple test patterns can be provided in order to test greater numbers of logic components within each SIMD.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of testing a logic device, comprising:
comparing a first test pattern received at an input of a first chain of logic device sub-modules with a first output from the first chain of logic devices, the first output being a first pattern transmitted through the first chain of logic devices, to determine whether a first type of logic sub-module failure has occurred; and
comparing a second test pattern received at an input of a second chain of logic device sub-modules with a second output from the second chain of logic devices, the second output being a second pattern transmitted through the second chain of logic devices, to determine whether a second type of logic sub-module failure has occurred;
wherein an occurrence of both the first and the second type of logic sub-module failure renders the logic device inoperable.

2. The method of claim 1, wherein an occurrence of either the first or the second type failure only degrades performance of the logic device.

3. The method of claim 1, wherein the first and second test patterns are known bit patterns.

4. The method of claim 1, wherein the first and second type failures include failures of one or more of the logic device sub-modules within the first and second chains respectively.

5. The method of claim 1, wherein when the logic device is tested the first and second test patterns are transmitted through the first and second chains respectively.

6. The method of claim 5, wherein the testing occurs during register transfer level design.

7. The method of claim 1, wherein the comparing the first test pattern and the comparing the second test pattern occur in parallel.

8. A testable logic device comprising:
a first plurality of interconnected logic sub-modules, the first plurality having a first input port and a first output port; and
a second plurality of interconnected logic sub-modules, the second plurality having a second input port and a second output port;
wherein the first plurality of interconnected logic sub-modules is configured for:
receiving a first test pattern at the first input port,
transmitting the first test pattern through the first plurality of interconnected logic sub-modules to the first output port, and
comparing the first test pattern at the first output port with the first test pattern received at the first input port to determine whether a first type of logic sub-module failure has occurred,
wherein the second plurality of interconnected logic sub-modules is configured for:
receiving a second test pattern at the second input port,
transmitting second test pattern through the second plurality of interconnected logic sub-modules to the second output port, and
comparing the second test pattern at the first output port with the second test pattern received at the second, input port to determine whether a second type of logic sub-module failure has occurred, and
wherein the first and second test patterns are used for determining defects within the first and second plurality of interconnected logic sub-modules respectively.

9. The testable logic device of claim 8, wherein the first and second plurality of logic sub-modules are comprised of flip-flops.

10. The testable logic device of claim 8, wherein an occurrence of the first type logic sub-module failure renders the logic device inoperable.

11. The testable logic device of claim 8, wherein an occurrence of the second type logic sub-module failure only degrades performance of the logic device.

12. The testable logic device of claim 8, wherein the determination of the first type logic sub-module failure and the determination of the second type logic sub-module failure occur in parallel.

13. The testable logic device of claim 8, wherein the determination of the first and second type logic sub-module failures occurs during register transfer level design.

14. The testable logic device of claim 13, wherein the first and second test patterns are each comprised of bit streams; and
wherein the bit streams are representative of internal logic structures of the first and second type logic sub-modules respectively.

15. A method of testing a logic device, comprising:
comparing a first test pattern provided at an input of a first chain of logic device sub-modules with an output from the first chain of logic devices to determine a first type of failure; and
comparing a second test pattern provided at an input of a second chain of logic device sub-modules with an out from the second chain of logic devices to determine a of second type failure;

wherein an occurrence of both the first and the second type failure renders the logic device inoperable and wherein the testing occurs during register transfer level design.

* * * * *

UNITED STATES PATENT AND TRADEMARK OFFICE
CERTIFICATE OF CORRECTION

| | | |
|---|---|---|
| PATENT NO. | : 8,914,691 B2 | Page 1 of 1 |
| APPLICATION NO. | : 13/546775 | |
| DATED | : December 16, 2014 | |
| INVENTOR(S) | : Angel Socarras | |

It is certified that error appears in the above-identified patent and that said Letters Patent is hereby corrected as shown below:

IN THE CLAIMS

Claim 15, column 10, line 62, delete "out" and insert -- output --.

Claim 15, column 10, line 63, after "determine a" delete "of".

Claim 15, column 10, line 64, after "type" insert -- of --.

Claim 15, column 11, line 1, delete "type" and insert -- types of --.

Signed and Sealed this
Twenty-third Day of June, 2015

Michelle K. Lee
*Director of the United States Patent and Trademark Office*